(12) United States Patent
Hurtubise et al.

(10) Patent No.: US 11,846,018 B2
(45) Date of Patent: Dec. 19, 2023

(54) METHOD AND WET CHEMICAL COMPOSITIONS FOR DIFFUSION BARRIER FORMATION

(71) Applicant: MacDermid Enthone Inc., Waterbury, CT (US)

(72) Inventors: Richard W. Hurtubise, Clinton, CT (US); Eric Yakobson, East Haven, CT (US); Shaopeng Sun, Lake Oswego, OR (US); Taylor L. Wilkins, Hamden, CT (US); Elie H. Najjar, Norwood, MA (US); Wenbo Shao, New Canaan, CT (US)

(73) Assignee: MacDermid Enthone Inc., Waterbury, CT (US)

( * ) Notice: Subject to any disclaimer, the term of this patent is extended or adjusted under 35 U.S.C. 154(b) by 0 days.

(21) Appl. No.: 17/665,871

(22) Filed: Feb. 7, 2022

(65) Prior Publication Data

US 2022/0259724 A1   Aug. 18, 2022

Related U.S. Application Data

(60) Provisional application No. 63/146,925, filed on Feb. 8, 2021.

(51) Int. Cl.
  *C23C 14/02* (2006.01)
  *C23C 16/02* (2006.01)
  (Continued)

(52) U.S. Cl.
  CPC ............ *C23C 16/403* (2013.01); *C23C 14/02* (2013.01); *C23C 14/081* (2013.01); *C23C 16/02* (2013.01); *C25D 3/00* (2013.01)

(58) Field of Classification Search
  CPC ..... C23C 16/403; C23C 14/02; C23C 14/081; C23C 16/02; C25D 3/00
  (Continued)

(56) References Cited

U.S. PATENT DOCUMENTS

| 4,140,535 A | 2/1979 | Boberski et al. |
| 6,080,447 A | 6/2000 | Ferroni et al. |

(Continued)

OTHER PUBLICATIONS

Grill, Alfred et al, Progress in the development and understanding of advanced low k and ultralow k dielectrics for very large-scale integrated interconnects-State of the art, Applied Physics Reviews 1, 011306, pp. 1-17, Jan. 15, 2014.
(Continued)

*Primary Examiner* — James E McDonough
(74) *Attorney, Agent, or Firm* — Carmody Torrance Sandak & Hennessey LLP (57) ABSTRACT

A method of forming a diffusion barrier layer on a dielectric or semiconductor substrate by a wet process. The method includes the steps of treating the dielectric or semiconductor substrate with an aqueous pretreatment solution comprising one or more adsorption promoting ingredients capable of preparing the substrate for deposition of the diffusion barrier layer thereon; and contacting the treated dielectric or semiconductor substrate with a deposition solution comprising manganese compounds and an inorganic pH buffer (optionally, with one or more doping metals) to the diffusion barrier layer thereon, wherein the diffusion barrier layer comprises manganese oxide. Also included is a two-part kit for treating a dielectric or semiconductor substrate to form a diffusion barrier layer thereon.

9 Claims, 3 Drawing Sheets

(51) Int. Cl.
*C25D 3/00* (2006.01)
*C23C 16/40* (2006.01)
*C23C 14/08* (2006.01)

(58) Field of Classification Search
USPC ..................................................... 106/1.05
See application file for complete search history.

(56) References Cited

U.S. PATENT DOCUMENTS

| | | | |
|---|---|---|---|
| 6,083,834 | A | 7/2000 | Chang et al. |
| 6,375,731 | B1 | 4/2002 | Carano et al. |
| 7,304,384 | B2 | 12/2007 | Koike et al. |
| 7,968,455 | B2 | 6/2011 | Lin et al. |
| 8,324,100 | B2 | 12/2012 | Akram et al. |
| 8,778,814 | B2 | 7/2014 | Owada et al. |
| 8,816,491 | B2 | 8/2014 | Chen et al. |
| 8,859,421 | B2 * | 10/2014 | Neishi ............... H01L 21/76867 |
| | | | 438/626 |
| 8,932,934 | B2 | 1/2015 | Chae et al. |
| 8,974,964 | B2 | 3/2015 | Padhi et al. |
| 9,087,881 | B2 | 7/2015 | Lin et al. |
| 9,382,627 | B2 | 7/2016 | Kollics |
| 9,490,211 | B1 | 11/2016 | Zhao et al. |
| 9,745,479 | B2 | 8/2017 | Wang et al. |
| 9,768,063 | B1 | 9/2017 | Kolics et al. |
| 9,842,805 | B2 | 12/2017 | Chen et al. |
| 9,881,833 | B1 | 1/2018 | Briggs et al. |
| 9,997,457 | B2 | 6/2018 | Jezewski et al. |
| 10,049,921 | B2 | 8/2018 | Draeger et al. |
| 10,103,057 | B2 | 10/2018 | Abelson et al. |
| 10,211,153 | B2 | 2/2019 | Briggs et al. |
| 10,214,823 | B2 | 2/2019 | Willigan et al. |
| 10,224,208 | B2 | 3/2019 | Mizutani et al. |
| 10,262,943 | B2 | 4/2019 | Kolics et al. |
| 10,332,861 | B2 | 6/2019 | Kao et al. |
| 10,438,847 | B2 | 10/2019 | Lai et al. |
| 10,483,162 | B2 | 11/2019 | Deng |
| 10,483,163 | B2 | 11/2019 | Joi et al. |
| 10,485,111 | B2 | 11/2019 | Law et al. |
| 10,487,404 | B2 | 11/2019 | Liu et al. |
| 10,501,846 | B2 | 12/2019 | Venkatraman et al. |
| 10,510,655 | B2 | 12/2019 | Chang Chien et al. |
| 10,529,622 | B1 | 1/2020 | Maniscalco et al. |
| 10,529,663 | B1 | 1/2020 | Nogami et al. |
| 10,553,477 | B2 | 2/2020 | Maestre Caro et al. |
| 10,593,591 | B2 | 3/2020 | Edelstein et al. |
| 2005/0199587 | A1 | 9/2005 | Bengston |
| 2005/0218519 | A1 | 10/2005 | Koike et al. |
| 2006/0089342 | A1 * | 4/2006 | Gavin .................. A61K 31/555 |
| | | | 514/184 |
| 2006/0154071 | A1 | 7/2006 | Homma et al. |
| 2006/0277691 | A1 * | 12/2006 | Saunier .................. A61K 8/494 |
| | | | 8/405 |
| 2012/0021603 | A1 | 1/2012 | Koike et al. |
| 2012/0135612 | A1 | 5/2012 | Matsumoto et al. |
| 2013/0143008 | A1 * | 6/2013 | Gotou ....................... B41J 2/01 |
| | | | 524/300 |
| 2013/0309405 | A1 | 11/2013 | Mukai et al. |
| 2014/0099789 | A1 | 4/2014 | Kolics |
| 2014/0227827 | A1 | 8/2014 | Bellemare et al. |
| 2015/0033980 | A1 | 2/2015 | Kolics |
| 2015/0096698 | A1 * | 4/2015 | Gantenbein ............ D21H 17/14 |
| | | | 524/53 |
| 2015/0325474 | A1 | 11/2015 | Gordon et al. |
| 2015/0328134 | A1 * | 11/2015 | Sturla ...................... C11D 1/88 |
| | | | 510/122 |
| 2015/0348902 | A1 | 12/2015 | Naik et al. |
| 2016/0028010 | A1 | 1/2016 | Park |
| 2017/0018506 | A1 | 1/2017 | Cao et al. |
| 2017/0181279 | A1 | 6/2017 | Koike et al. |
| 2018/0347041 | A1 | 12/2018 | Kim et al. |
| 2019/0393409 | A1 | 12/2019 | Maniscalco et al. |
| 2020/0020577 | A1 | 1/2020 | Maniscalco et al. |
| 2020/0020581 | A1 | 1/2020 | Maniscalco et al. |
| 2020/0035420 | A1 | 1/2020 | Chen et al. |

OTHER PUBLICATIONS

Neishi, Koji et al, Formation of a manganese oxide barrier layer with thermal chemical vapor deposition for advanced large-scale integrated interconnect structure, Applied Physics Letters 93, 032106, vol. 93, pp. 1-3, Jul. 23, 2008.

Nguyen, Son V. et al, Selective manganese deposition for Cu_low k nano device interconnect, United States (no date).

Frye, Don et al, Low K & Ultra Low K Metrology comes to the rescue, Semiconductor Fab Materials, International Conference on Characterization and Metrology for ULSI Technology Mar. 16, 2005, pp. 1-36.

Vitale, Steven A. et al, Etching of organosilicate glass low-k dielectric films in halogen plasmas, Journal of Vacuum Science & Technology, vol. 20, No. 3, May/Jun. 2002, pp. 651-660.

Nguyen, Son et al, Lightly porous SiCOH 2.7 dielectric film development for 65/45/32 nm advanced nanoelectronic CMOS devices, 214th ECS Meeting, Abstract #2076, The Electrochemical Society, 2008.

Hatton, Benjamin D. et al, Materials chemistry for low-k materials, Materials Today, Mar. 2006, vol. 9, No. 3, pp. 22-31.

Petkov, Mihail P. et al, Low-k interlevel dielectrics technology, Technology Readiness Overview: Mar. 2003, pp. 1-20.

Moran-Mirabal, Jose, Piranha Cleaning—Glass Surfaces, Moran-Mirabal Research Group, May 2014, pp. 1-3.

Rhoades, Robert L. et al, CMP chemistry and materials challenges for ultra low-k integration, Semiconductor Fabtech, 32nd Edition, pp. 1-6 (no date).

Jielin, Xie, Study of TMCTS based PECVD carbon-doped low dielectric constant material, A thesis submitted for the degree of master of science Department of Physics National University of Singapore 2004, pp. 1-119.

Liu, Ming, Pore Characterization of Ultralow-k Dielectric Thin Films Using Positronium Annihilation Spectroscopy, A dissertation submitted in partial fulfillment of the requirements for the degree of Doctor of Philosophy (Physics) in The University of Michigan 2008, pp. 1-268.

* cited by examiner

METHOD AND WET CHEMICAL COMPOSITIONS FOR DIFFUSION BARRIER FORMATION

FIELD OF THE INVENTION

The present invention relates generally to wet methods of forming diffusion barriers on dielectric and semiconductor materials for interconnect manufacture.

BACKGROUND OF THE INVENTION

Integrated circuit devices typically include circuit elements such as transistors, capacitors and resistors formed within or on a semiconductor substrate. Interconnect structures are used to electrically couple or connect the discrete circuit elements into functional circuits.

These interconnect structures may be fabricated from various metals and metal alloys, including copper and cobalt. Copper as a metal is the second-best conductor after silver and is often the most likely choice for the main conductor metal for many IC metallization applications. Copper is also well-known to be prone to diffusion and electromigration (EM) which can lead to void formation and failure and therefore must be completely encapsulated in a diffusion barrier. Therefore, these interconnect structures typically include a barrier layer such as tantalum or tantalum nitride, and combinations thereof (e.g., tantalum nitride/tantalum).

The material of the barrier layer must be carefully selected. If the barrier layer is too thick, it takes up a portion of the copper line and increases the effective line resistance. On the other hand, if the barrier layer is too thin, it will not act as an efficient metal barrier layer, which can affect device performance and result in poor reliability. Further, as the device size shrinks, the barrier layer and the cap layer for an interconnect structure also shrinks (i.e., becomes thinner) while needing to retain barrier properties.

Metallization is a key step in the manufacturing sequence of semiconductor devices. The present invention is directed to a process and compositions that can be used for deposition of a diffusion barrier metal and/or metal oxide directly onto a dielectric or semiconductor material such as $SiO_2$, $Si_3N_4$, $Si_xC_yO_z$, Si, Ge, GaAs or other dielectric or semiconductor materials used for IC manufacture.

Conventionally, for deposition of metals or metal oxides onto dielectric or semiconductor materials, diffusion barrier layers are deposited using dry vacuum processes such as physical vapor deposition (PVD), chemical vapor deposition (CVD), or atomic layer deposition (ALD). However, these dry vacuum processing steps suffer from several limitations and drawbacks including:

Vacuum processes are significantly more expensive than wet deposition methods (such as electrochemical deposition (ECD) or electroless deposition (ELD)). Dry vacuum methods require highly specialized and sophisticated processing tools, specialty high-purity gases with dedicated delivery infrastructure, precursor materials and high-purity target materials to carry out and maintain these vacuum processes.

Vacuum metal deposition rates can be very low and therefore vacuum processing times can be much longer for vacuum steps than for wet ECD/ELD steps thereby reducing overall fab productivity.

As IC geometries are scaled down with every new technology node, uniform coverage and thickness of a vacuum diffusion barrier combined with a conductive seed layer thickness presents a challenge, which in turn is problematic for subsequent Cu ECD metallization gap fill steps.

Vacuum diffusion barriers such as Ta and Ta nitride have lower conductivity than Cu which decreases the conductivity of the interconnect metal stack as these layers take up the volume that could have, been occupied by much more conductive Cu.

Mn films deposited on Si by dry vacuum methods (CVD, PVD and ALD) and thermally treated to form $Mn_xSi_yO_z$ have been reported to have excellent diffusion barriers properties against Cu diffusion. However, these dry vacuum methods require long processing times and the use of vacuum equipment.

Thus, it would be desirable to develop a method of depositing a manganese film to form a diffusion barrier layer on a dielectric or semiconductor substrate that overcomes the deficiencies of these dry vacuum methods.

SUMMARY OF THE INVENTION

It is an object of the present invention to provide a process for providing an improved barrier layer for a metal interconnect on a dielectric or semiconductor material.

It is another object of the present invention to provide a process for preparing a manganese oxide barrier layer for a metal interconnect on a dielectric or semiconductor material that can be doped with one or more metals.

It is still another object of the present invention to provide a wet process for deposition of a manganese oxide barrier layer for a metal interconnect on the dielectric or semiconductor material.

It is still another object of the present invention to provide a wet process for providing a manganese oxide barrier layer for a metallized layer, such as a metallized copper layer.

To that end, in one embodiment, the present invention relates generally to a method of depositing a diffusion barrier layer on a dielectric or semiconductor substrate, the method comprising the steps of:
1. treating the dielectric or semiconductor substrate with an aqueous pretreatment solution; and
2. contacting the treated dielectric or semiconductor substrate with an aqueous deposition solution comprising manganese compounds and an inorganic pH buffer to deposit the diffusion barrier on the dielectric or semiconductor substrate, wherein the diffusion barrier layer comprises manganese oxide; and
3. optionally, repeating step a) after step b) to further enhance the adhesion of the diffusion barrier layer to subsequently deposited copper.

BRIEF DESCRIPTION OF THE FIGURES

The present invention will now be described with reference to the following figures, in which.

DETAILED DESCRIPTION OF THE PREFERRED EMBODIMENTS

The present invention is directed to a method for deposition of a diffusion barrier layer for metal interconnects on dielectric and semiconductor materials based on a wet process. The wet process of the instant invention offers several significant advantages over conventional dry vacuum processes of forming diffusion barrier layers including, significantly shorter processing time and associated higher productivity, elimination of the need for vacuum equipment/disposables, and higher conductivity of the interconnects.

The present invention describes a wet method for $MnO_2$ deposition with subsequent optional step of heat treatment in vacuum, reducing atmosphere or hydrogen plasma.

Manganese can be doped with one or more metals to enhance its barrier performance, adhesion, continuity, nucleation density and uniformity. Examples of doping metals include zinc, cobalt, ruthenium, palladium, zirconium, chromium, magnesium, titanium, tungsten, rhenium, tantalum and the like.

"A," "an," and "the" as used herein refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower", "above", "upper" and the like, are used for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly. It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

The present invention relates generally to a wet method of depositing a manganese oxide barrier layer on a dielectric or semiconductor substrate. Once $Mn_xSi_yO_z$ forms, it can perform as a diffusion barrier.

In one embodiment, the present invention relates generally to a method of depositing a diffusion barrier on a dielectric or semiconductor substrate, the method comprising the steps of:

1. treating the dielectric or semiconductor substrate with an aqueous pretreatment solution; and
2. contacting the treated dielectric or semiconductor substrate with an aqueous deposition solution comprising manganese compounds and an inorganic pH buffer to deposit the diffusion barrier on the dielectric or semiconductor substrate, wherein the diffusion barrier layer comprises manganese oxide; and
3. optionally, repeating step a) after step b) in order to further enhance the adhesion of the diffusion barrier layer to subsequently deposited metal (i.e., copper).

As described herein, the aqueous pretreatment solution includes one or more adsorption promoting ingredients capable of preparing the dielectric or semiconductor substrate for manganese oxide deposition thereon. In one embodiment, the one or more adsorption promoting ingredients comprise one or more nitrogen silicon and/or carbon (N, Si, and/or C) based cationic polymers. These nitrogen, silicon and/or carbon based cationic polymers or oligomers typically have a cationic functional group containing a nitrogen, silicon, and/or carbon atom. In the case of a nitrogen-based cationic functional group, it may be a primary nitrogen atom, a secondary nitrogen atom, a tertiary nitrogen atom, or a quaternary nitrogen atom. The nitrogen, silicon and/or carbon-based cationic polymer or oligomer may have an average molecular weight in the range of about 50 to about 1,000,000 Da, more preferably a weight average molecular weight in the range of about. 400 and 10,000 as measured by size exclusion chromatography. In one embodiment the cationic polymer or oligomer is a quaternary nitrogen-based cationic polymer or oligomer or a silicon-based cationic polymer or oligomer.

The polymer is formed by the polymerization of a monomer containing the nitrogen, silicon, and/or carbon-based cationic functional group, which monomer may be, for example, an alkyleneimine have 2 to 12 carbon atoms, more preferably 2 to 8 carbon atoms, allylamine, diallydimethylammonium salt, vinylpyridine, lysine, methyl vinyl pyridine, p-vinylpyridine, siloxane, and combinations of one or more of the foregoing.

Examples of nitrogen-based cationic polymers and oligomers include amino-functional substituted polysiloxane polymers, polyethylenimine, methylaminoethyl resins, alkyltrimethylammonium chlorides, and others. Esters of olefinic alcohols, aminoalkyl esters, esters of ether alcohols, cycloalkyl esters, and esters of halogenated alcohols and polyethylene oxides, such as materials available under the trade names NSR N-10, NSR N3000, and NSR 301 from Union Carbide Corp., may also be used in the practice of the instant invention and are described, for example, in U.S. Pat. No. 6,375,731 to Carano et al., the subject matter of which is herein incorporated by reference in its entirety.

In one embodiment, the one or more adsorption promoting ingredients may be selected from the group consisting of polysiloxanes, including amino-substituted polysiloxanes, such as Gelest N-(2-Aminoethyl)-3-aminopropyltrimethoxsilane-propyltrimethoxysilane, N-[3-(trimethoxysilyl)propyl]ethylenediamine-(trimethoxysilyl)propane, oligomeric co-hydrolysate, Gelest N-3-[(Amino (polypropyleneoxy)]aminopropyltrimethoxysilane, N-[3-(Trimethoxysilyl)propyl]polypropylene oxide diamine or 3-Aminopropyltris(methoxyethoxyethoxy)silane, 3-[Tris (methoxyethoxyethoxy)silyl]propylamine, 9,9-Bis[2-(2-methoxyethoxy)ethoxy]-2,5,8-trioxa-9-siladodecan-12-amine; γ-Aminopropyltris(metboxyethoxyethoxy)silane, by way of example and not limitation. One example of an amino-functional polysiloxane is available under the trade name Dynasylan® Hydrosil 1151 (an aqueous 3-aminopropylsilane hydrolysate) available from Evonik Industries AG.

These adsorption promoting ingredients can be used alone or in combination with other ingredients in an aqueous solution. In one embodiment, the aqueous pretreatment solution comprise the one or more cationic nitrogen, and/or carbon-based polymers in a concentration of 1 to 500 g/L, more preferably 3 to 150 g/L, more preferably 25 to 125 g/L.

The one or more additional ingredients may include one or more alkalinity agents, adsorption enhancers, adhesion promoters, dispersants, emulsifiers, coupling agents and/or surfactants. Optionally, the aqueous pretreatment solution may also include cupric ions and/or a source of chloride.

One example of a pretreatment solution in accordance with the present invention comprises:

the one or more adsorption promoting ingredients, wherein the adsorption promoting ingredient comprise one or more cationic nitrogen, silicon and/or carbon-based polymers or oligomers; in combination with one or more of:
  a. an alkalinity agent;
  b. an adsorption enhancer;
  c. a surfactant;
  d. a source of copper; and
  e. a source of chloride.

Suitable alkalinity sources include, but are not limited to, alkanolamines, alkali metal hydroxides, alkali metal carbonates (e.g., sodium carbonate, potassium carbonate, sodium bicarbonate, potassium bicarbonate, sodium sesquicarbonate, potassium sesquicarbonate, and the like, or combinations thereof), alkali metal borates (e.g., sodium borate, potassium borate, and the like, or combinations thereof), alkali metal oxides (e.g., sodium oxide, potassium oxide, and the like, or combinations thereof), and the like, or combinations thereof. In one preferred embodiment, the alkalinity source includes an alkanolamine.

In a preferred embodiment, the alkalinity source(s) can include ethanolamines and/or carbonates, which can be used alone or in combination. In a further preferred aspect, the alkalinity sources include monoethanolamine, diethanolamine, triethanolamine, 2-amino-2-methyl-1-propanol, monoisopropanolamine, diisopropanolamine, 2-(2-Aminoethoxyl)ethanol (DGA) and/or an alkali metal carbonate. If used, the alkalinity agent(s) may be present in the pretreatment solution at a concentration in the range of 0.5 to 10 g/L, more preferably within a range of 2 to 8 g/L.

The adsorption enhancer is preferably selected from the group consisting of alkanolamines such as triethanolamine (TEA), diethanolamine (DEA), 3-amino-1-propanol, amino-2-propanol, and the like. In a preferred embodiment, the adsorption enhancer comprises a mixture of monoethanolamine and triethanolamine. As is readily apparent, triethanolamine and diethanolamine are alkanolamines and can thus function as both alkalinity agents and adsorption enhancers in the composition. If used in the pretreatment solution, the concentration of the one or more adsorption enhancers may be in the range of about 0.01 to about 5 g/L, more preferably about 0.05 to about 0.5 g/L.

In one embodiment, the surfactant comprises a polyoxyalkylene alkylether. For example, the surfactant may comprise a surfactant represented by the following general formula (1):

RO(CH2CH(CH3)O)$_x$(CH2CH2O)$_y$H    (1)

In the general formula (1), R is alkyl group having 3 to 20 carbon atoms, preferably alkyl group having 12 carbon atoms; x and y are values representing the polymerization degree of the oxypropylene moiety and of the oxyethylene moiety, respectively. In one embodiment, x has a value between about 1 and 20, more preferably between about 3 to 10 and y has a value between about 1 and 20, more preferably between about 3 and 10. Commercial polyoxyalkylene alkylether compounds include, for example EMULGEN LS-106, EMULGEN LS-110, EMULGEN LS-114 and EMULGEN MS-110, all available from Kao Co., Ltd.

In one embodiment, the surfactant can play a role of adhesion promoter, dispersant, emulsifier, and/or coupling agent.

The pretreatment solution also optionally, but preferably, contains a source of copper. In one embodiment, the source of copper is copper sulfate pentahydrate, or another suitable copper salt.

The pretreatment solution also optionally, but preferably, contains a source of chloride. In one embodiment, the source of chloride is selected from the group consisting of sodium chloride, potassium chloride, ammonium chloride, magnesium chloride, cupric chloride, or another commercially available chloride source.

The dielectric or semiconductor substrate is contacted with the pretreatment solution by immersing or otherwise contacting the dielectric substrate with the pretreatment solution for a sufficient time to pretreat the surface of the dielectric substrate. Adsorption is a very quick process which results in an adsorption/desorption rate equilibrium. Once this adsorption/desorption equilibrium point is reached, the dielectric substrate can be removed from the pretreatment solution. In one embodiment, the dielectric substrate is contacted with the pretreatment solution for between about 15 seconds to about 10 minutes, more preferably about 20 seconds to about 6 minutes, most preferably about 30 seconds to about 4 minutes.

The temperature of the pretreatment solution is typically maintained in the range of about 20 to about 80° C., more preferably about 40 to about 50° C. while the dielectric substrate is being contacted with the pretreatment solution. After contact with the pretreatment solution, the dielectric substrate is preferably rinsed with water, more preferably deionized water, to remove excess pretreatment solution from the dielectric substrate.

This pretreatment step prepares the surface of the dielectric or semiconductor substrate for manganese oxide deposition. Without the pretreatment step described herein, the manganese oxide deposition will generally be much less effective.

Once the dielectric or semiconductor substrate has been contacted with the pretreatment solution and then rinsed, the pretreated dielectric or semiconductor substrate is contacted with the manganese oxide deposition solution described herein.

The manganese oxide deposition solution preferably comprises a suitable manganese compound and an inorganic buffer.

In one embodiment, the manganese compound is an oxidizing agent. For example, the manganese compound may comprise a manganese salt such as sodium permanganate, potassium permanganate or magnesium permanganate or combinations thereof. Sodium permanganate is the most soluble but its presence in significant concentration is undesirable in a damascene process. Thus, alternative permanganates are preferred such as magnesium permanganate or zinc permanganate.

For example, in the case of zinc permanganate, the concentration is preferably within the range of about 0.1 to about 5 g/L.

The manganese deposition solution also comprises an inorganic pH buffer, which may be boric acid, borate, phosphoric acid or phosphate. In one embodiment, the inorganic pH buffer is boric acid, which is very stable to oxidation in hot permanganate solution. Another inorganic pH buffer that may be used in the composition of the instant invention is phosphate. In contrast to the buffers described herein, many prior art buffers are organic and are therefore vulnerable to oxidation. The saturation point of boric acid in permanganate is about 15 g/L, so a preferred concentration of boric acid in the solution is within the range of about 5 to 15 g/L, more preferably 8 to 12 g/L.

Various dielectric substrates can be used for interconnect manufacture. However, achieving high adhesion on some of them including, for example, SiCO-based low-k dielectric substrates, can be challenging. Therefore, in some embodiments, co-deposition of a doping compound or doping metal along with manganese is beneficial to enhance the adhesion of the manganese oxide film.

Examples of these doping metals include, but are not limited to, zinc, cobalt, nickel, chromium, molybdenum, tungsten, rhenium, palladium, rhodium, platinum, iridium, osmium, ruthenium, titanium, zirconium, tantalum, magnesium and other similar metals, which may be used alone or in combination with each other. In a preferred embodiment, the co-deposited doping metal comprises one or more of zinc, cobalt, nickel, chromium, rhenium, palladium, ruthenium, tungsten, titanium, zirconium, tantalum or magnesium.

Depending on the nature of the co-deposited doping metal, its position in the electromotive series, and relative stability of its oxidation states, some or all of it can be in the form of an oxide(s). In some embodiments, both manganese and the doping metal oxide(s) can be reduced to metal by annealing in a forming gas or hydrogen plasma.

Optionally, the doping metal may be deposited in a separate subsequent step that can go through a wet reduction step based on an aminoborane, hydrazine, borohydride, hypophosphite or other reduction solution or a dry reduction step using a forming gas or hydrogen plasma.

Other doping metals that can be included in the manganese deposition solution include metals that can modify nucleation rate and grain size to improve continuity, uniformity and reduce roughness in order to more carefully control the thickness of the $MnO_2$ film, which is critical due to the geometries of the features. These doping metals include but are not limited to, for example, molybdenum, germanium, indium, hafnium, and/or vanadium.

Alternatively, the doping metal can be added to the manganese deposition solution as a doping compound. Examples of these doping compounds include, but are not limited to, cobalt chloride, cobalt sulfate, hexafluorozirconic acid, zirconium sulfate, chromium sulfate, hexafluorotitanic acid, magnesium sulfamate, magnesium chloride, palladium chloride, palladium bromide, palladium sulfate, ammonium tungstate, nickel sulfamate, nickel chloride, nickel sulfate, ruthenium chloride, tantalum chloride, ammonium molybdate, aluminum sulfate, gallium nitrate, indium sulfate, hafnium acetate, vanadyl sulfate and the like. In another embodiment, the doping compound is a fluoride salt, such as titanium(4+) dihydrogen hexafluoride.

Optionally, the manganese oxide deposition solution may include an acrylic block copolymer, such as a polyacrylate/methacrylate block copolymer.

The pH of the manganese oxide deposition solution is very important as it controls the manganese redox potential and thus determines the equilibrium between various manganese oxidation states in turn affecting the manganese oxide uptake. In one embodiment, the pH of the manganese oxide deposition solution is preferably between about 2 to about 7, more preferably about 3 to about 6, more preferably at about 3.5 to about 5.5. The deposition time is about 0.5 to about 10 minutes, more preferably about 2 to 6 minutes. The temperature of the manganese oxide deposition solution is preferably in the range of about 70 to about 100° C., more preferably about 80 to about 90° C.

After deposition, the manganese oxide layer is rinsed with water. In one embodiment, if the manganese oxide and second co-deposited metal are deposited in separate steps, the oxide layer(s) may be rinsed with water after each step.

In one embodiment, the substrate is a dielectric substrate comprises a dielectric material including, but not limited to, silicon oxide ($SiO_2$), silicon nitride (e.g., ($Si_3N_4$), hydrogenated silicon oxycarbide (SiCOH), SiCH, SiCNH, other dielectric and semiconductor materials, or other types of silicon-based low-k dielectrics (e.g., k<~4.0), porous dielectrics, or known ULK (ultra-low-k) dielectric materials (k<~2.5). The thickness of the dielectric layer defines a vertical height (or thickness) of the metallization that is formed within the dielectric layer, which will vary depending on the application. In another embodiment, the substrate is a semiconductor material, which may be selected from the group consisting of silicon, germanium, and gallium arsenide. Other dielectric and semiconductor materials can also be treated using the wet process described herein to form a diffusion barrier layer thereon.

As discussed above, in one embodiment, the aqueous pretreatment solution is subsequently applied to the dielectric or semiconductor substrate after the diffusion barrier is deposited to further enhance adhesion of the diffusion barrier layer to a subsequently deposited metal layer, which metal layer may be copper.

In one embodiment, an additional adhesion promoting step can be performed using an adhesion promoting composition. If used, this step may be performed before the pretreatment step, before the manganese deposition step, or after the manganese deposition step. If used, this adhesion promoting composition includes a polyacrylate copolymer and a surfactant. Suitable surfactants include, but are not limited to polyether polyols, polyacrylates, alcohol ethoxylates, EO/PO block copolymers, aminopropionate, sulfosuccinates, lauramine oxide, and other similar compounds, which can be used alone or in combination. The concentration of the polyacrylate copolymer may be in the range of about 0.5 to about 10 g/L, more preferably about 0.5 to about 5 g/L. The concentration of the surfactant may be in the range of about 0.1 to about 10 g/L, more preferably about 0.5 to about. 3.0 g/L.

The diffusion barrier layer may also be subjected to a step of thermally treating the diffusion barrier layer, wherein the thermal treatment step is performed by annealing in a forming gas. This annealing step converts manganese oxide into $Mn_xSi_yO_z$.

The present invention also relates generally to a two-part kit for treating a dielectric or semiconductor substrate to form a manganese oxide barrier layer thereon, the kit comprising:
  a) an aqueous pretreatment solution comprising one or more adsorption promoting ingredients capable of preparing the substrate for manganese oxide deposition thereon; and
  b) a manganese oxide deposition solution, the manganese oxide deposition solution comprising a manganese compound and an inorganic pH buffer.

In addition, as discussed above, the manganese oxide deposition solution may also comprise one or more co-deposited doping metals or their oxides or one or more doping compounds.

The invention will now be described in accordance with the following non-limiting examples.

EXAMPLE 1

A pretreatment solution was prepared according to Table 1 below, and a manganese oxide deposition solution was prepared in accordance with Table 2 below.

TABLE 1

Pretreatment solution

| Component | Concentration (g/L) |
|---|---|
| Monoethanolamine (MEA) | 4.456 |
| Triethanolamine (TEA) | 0.248 |
| Polyoxyalkylene alkyl ether LS 110 | 0.248 |
| Substituted acrylamide polymer XW 189 | 1.980 |
| Polyallylamine hydrochloride EXP 954 | 0.050 |
| Copper sulfate pentahydrate | 0.008 |
| Sodium chloride | 0.248 |

TABLE 2

Manganese Deposition Solution

| Component | Concentration (g/L) |
|---|---|
| Boric acid | 10.0 |
| Sodium permanganate | 61.2 |

A dielectric substrate was processed according to the following process sequence:

Process Sequence:

A) Surface treatment solution #1, 4 minutes, 50° C.

B) Deionized water (DIW) rinse

C) $MnO_2$ deposition solution, 4 minutes, 85° C.

D) DIW rinse

E) $N_2$ dry

Sample Surface Analysis:

A wafer coupon sample was stripped in 10 mL stripping solution containing 10% (v/v) sulfuric acid with 5% (v/v) hydrogen peroxide. 0.5300 mg/L Mn was detected by inductively coupled plasma (ICP) atomic emission spectroscopy whereas less than 0.0500 mg/L Mn was detected from a blank control sample.

Figure 1:
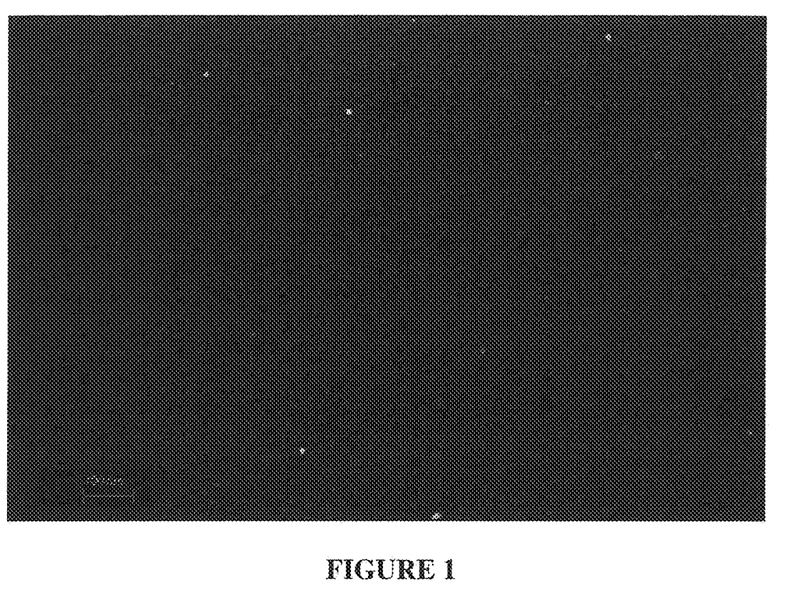
FIG. 1 depicts a Top-down SEM demonstrating a dense $MnO_2$ film on a dielectric surface in accordance with Example 1.

Therefore, the process described in Example 1 produced a manganese oxide layer on the surface of the dielectric layer. FIG. 1 depicts a top-down SEM image that demonstrates the $MnO_2$ film on the dielectric surface.

This example was repeated using a bare silicon coupon in place of a dielectric wafer coupon. After processing, the silicon coupon was subjected to Cu deposition and annealing at 400° C. Thereafter the coupon was inspected for copper silicide formation on the back side. The manganese oxide film was found to perform as an effective diffusion barrier.

EXAMPLE 2

A pretreatment solution was prepared according to Table 3 below, and a manganese oxide deposition solution was prepared in accordance with Table 2 of Example 1.

TABLE 3

Pretreatment solution

| Component | Concentration (g/L) |
|---|---|
| Sodium Carbonate | 5.0 |
| Quaternary Polyvinylimidazolium salt | 2.970 |
| Acrylic acid maleic anhydride polymer sodium salt | 1.288 |

A dielectric substrate was processed according to the process sequence described in Example 1.

As with Example 1, a wafer coupon sample was stripped in 10 mL stripping solution containing 10% (v/v) sulfuric acid with 5% (v/v) hydrogen peroxide. 0.0500 mg/L Mn was detected by ICP whereas <0.0500 mg/L Mn was detected from a blank control sample.

This example was repeated using a bare silicon coupon in place of a dielectric wafer coupon. After processing, the silicon coupon was subjected to Cu deposition and annealing at 400° C. Thereafter the coupon was inspected for copper silicide formation on the back side. The manganese oxide film was found to perform as an effective diffusion barrier.

EXAMPLE 3

A pretreatment solution was prepared according to Table 4 below, and a manganese oxide deposition solution was prepared in accordance with Table 2 of Example 1.

TABLE 4

Pretreatment solution

| Component | Concentration (g/L) |
|---|---|
| Amino-functional substituted polysiloxane polymer (HS-1151) | 30.0 |
| DIW | Balance |

A dielectric substrate was processed according to the following process sequence:

Process Sequence:

A) Surface treatment solution, 1 minutes, RT

B) Deionized water (DIW) rinse, 20 sec

C) $MnO_2$ deposition solution, 4 minutes, 85° C.

D) Light DIW rinse

E) Cured, 10 minutes, 80° C.

As with Example 1, a wafer coupon sample was stripped in 10 mL stripping solution containing 10% (v/v) sulfuric acid with 5% (v/v) hydrogen peroxide. 0.1100 mg/L Mn was detected by ICP whereas <0.0500 mg/L Mn was detected from a blank control sample.

Figure 2:
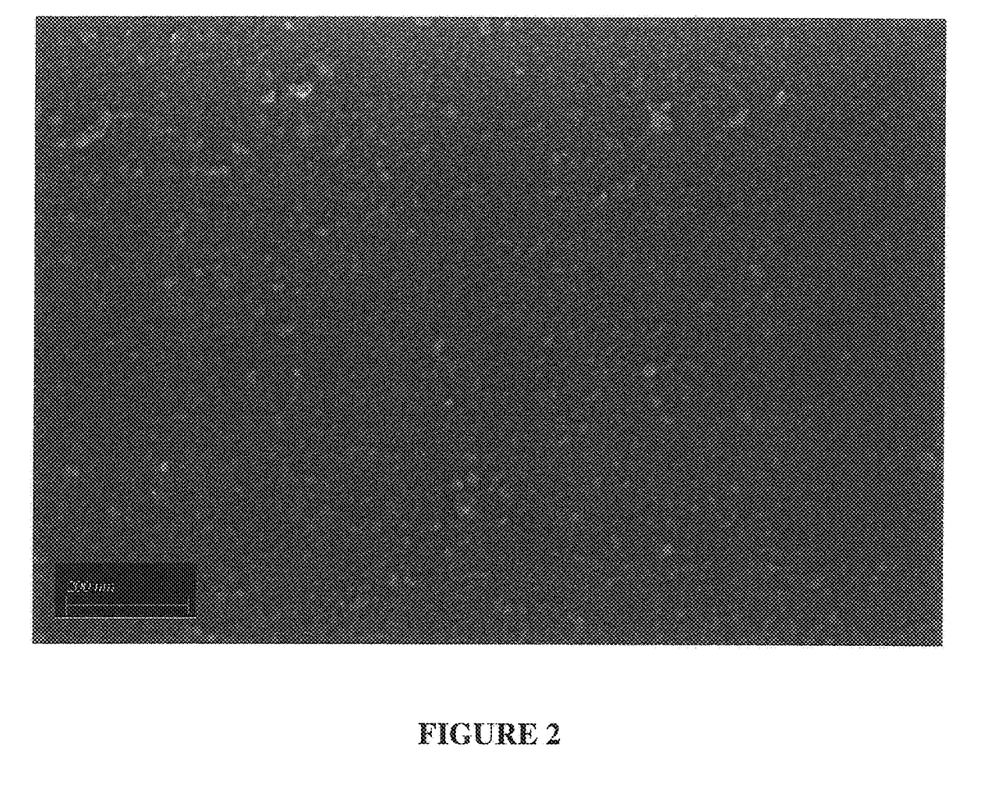
FIG. 2 depicts a Top-down SEM demonstrating a dense $MnO_2$ film on a dielectric surface in accordance with Example 3.

FIG. 2 depicts a top-down SEM image that demonstrates the $MnO_2$ film on the dielectric surface.

This example was repeated using a bare silicon coupon in place of a dielectric wafer coupon. After processing, the silicon coupon was subjected to Cu deposition and annealing at 400° C. Thereafter the coupon was inspected for copper silicide formation on the back side. The manganese oxide film was found to perform as an effective diffusion barrier.

EXAMPLE 4

Wafer coupon samples were also prepared on bare silicon substrate. As with Example 1, a wafer coupon sample was stripped in 10 mL stripping solution containing 10% (v/v) sulfuric acid with 5% (v/v) hydrogen peroxide. 0.2300 mg/L Mn was detected by ICP whereas <0.0500 mg/L Mn was detected from a blank control sample.

The process described can deposit an effective manganese oxide barrier layer for the deposition of a metal layer thereon for both dielectric and semiconductor substrates.

Figure 3:
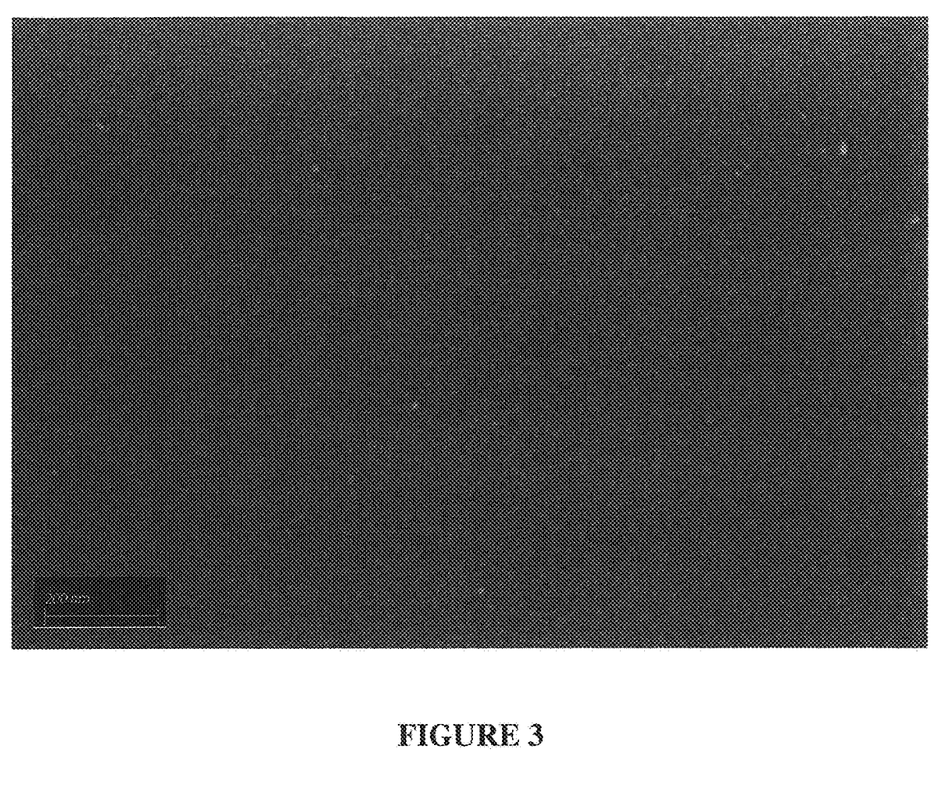
FIG. 3 depicts a Top-down SEM demonstrating a dense $MnO_2$ film on a bare silicon surface in accordance with Example 4.

FIG. 3 depicts a top-down SEM image that demonstrates the $MnO_2$ film on bare Si substrate.

EXAMPLE 5

A pretreatment solution was prepared according to Table 5 below, and a manganese oxide deposition solution was prepared in accordance with Table 2 of Example 1.

TABLE 5

Pretreatment solution

| Component | Concentration (g/L) |
|---|---|
| Amino-functional substituted polysiloxane polymer (SV-160) (Dynasylan® SIVO 160) | 120.0 |
| DIW | balance |

A dielectric substrate was processed according to the process sequence described in Example 1.

As with Example 1, a wafer coupon sample was stripped in 10 mL stripping solution containing 10% (v/v) sulfuric acid with 5% (v/v) hydrogen peroxide. 0.0946 mg/L Mn was detected by ICP whereas <0.0500 mg/L Mn was detected from a blank control sample.

This example was repeated using a bare silicon coupon in place of a dielectric wafer coupon. After processing, the silicon coupon was subjected to Cu deposition and annealing at 400° C. Thereafter the coupon was inspected for copper silicide formation on the back side. The manganese oxide film was found to perform as an effective diffusion barrier.

EXAMPLE 6

Wafer coupon samples were pretreated with the solution described in Table 1 from Example 1 and then treated with the manganese oxide deposition solution described in Table 2 from Example 1 with the addition of a co-deposited metal compounds. The co-deposited metals tested included:
1. Zn;
2. Co;
3. Ti;
4. Zr;
5. Pd;
6. blank dielectric control sample, without any deposition The dielectric substrate was processed according to the process sequence described in Example 1.

ICP detected Mn in samples with. Zn, Co, Ti, Zr, and Pd inclusions. The values were 0.171 mg/L, 0.292 mg/L, 0.396 mg/L, 0.458 mg/L, 0.31 mg/L, respectively. A blank control sample had an ICP result of <0.05 mg/L Mn.

Four wafer coupon samples were analyzed using X-ray photoelectron spectroscopy (XPS). Two of them were pretreated with the solution described in Table 1 from Example 1 and then treated with the manganese deposition solution described in Table 2 from Example 1 with the addition of Zn and the other two were blank dielectric control samples without any deposition. One sample survey with co-deposited MnZn film showed 13.7 at. % Mn and 0.9 at. % Zn and the other MnZn sample showed 14.4 at. % Mn and 1.2 at. % Zn.

This example was repeated using a bare silicon coupon in place of a dielectric wafer coupon. After processing, the silicon coupon was subjected to Cu deposition and annealing at 400° C. Thereafter the coupon was inspected for copper silicide formation on the back side. The manganese oxide film was found to perform as an effective diffusion barrier.

EXAMPLE 7

Wafer coupon samples were pretreated with the solution described in Table 4 from Example 3, with the exception that the concentration of HS-1151 was reduced from 30 g/L to 15 g/L. Then the water coupon samples were treated with manganese oxide deposition solution. The deposition solutions tested are described in Table 6 and Table 7 below.

TABLE 6

Copolymer additive (1) in manganese deposition solution

| Component | Concentration (g/L) |
|---|---|
| Boric Acid | 10 |
| Sodium permanganate | 0.612 |
| Polyacrylate/methacrylate block-copolymer A | 0.1 |

TABLE 7

Copolymer additive (2) in manganese deposition solution

| Component | Concentration (g/L) |
|---|---|
| Boric Acid | 10 |
| Sodium permanganate | 0.612 |
| Polyacrylate/methacrylate block-copolymer B | 0.6 |

The dielectric substrate was processed according to the process sequence described in Example 3.

As with Example 1, a wafer coupon sample was stripped in 10 mL stripping solution containing 10% (v/v) sulfuric acid with 5% (v/v) hydrogen peroxide. The ICP values detected of Mn for samples treated with copolymer (1) and copolymer (2) were 0.2070 mg/L and 0.1570 mg/L, respectively. A blank control sample had an ICP result of <0.0500 mg/L Mn.

The process described can deposit an effective manganese oxide barrier layer for the deposition of a metal layer thereon. The wet process described herein enhanced adhesion between the dielectric/semiconductor substrates and the manganese oxide barrier layer.

This example was repeated using a bare silicon coupon in place of a dielectric wafer coupon. After processing, the silicon coupon was subjected to Cu deposition and annealing at 400° C. Thereafter the coupon was inspected for copper silicide formation on the back side. The manganese oxide film was found to perform as an effective diffusion barrier.

EXAMPLE 8

Wafer coupon samples were pretreated with the solution described in Table 4 from Example 3, with the exception that the concentration of HS-1151 was reduced from 30 g/L to 15 g/L. Then the wafer coupon samples were treated with the manganese oxide deposition solution described in Table 8 below.

TABLE 8

Polyacrylate copolymer manganese deposition solution

| Component | Concentration (g/L) |
|---|---|
| Boric Acid | 10 |
| Sodium Permanganate | 0.612 |
| Polyacrylate/methacrylate block-copolymer-A | 0.1 |
| Metal Salt* | 0.1 |

Compatible metal salts can be found in Example 6.

The dielectric substrate was processed according to the process sequence described in Example 3.

As with Example 1, a wafer coupon sample was stripped in 10 mL stripping solution containing 10% (v/v) sulfuric acid with 5% (v/v) hydrogen peroxide. ICP analysis detected 0.156 mg/L of Mn in the sample. A blank control sample had an ICP result of <0.0500 mg/L Mn.

The process described can deposit an effective manganese oxide barrier layer for the deposition of a metal layer thereon. The wet process described herein enhanced adhesion between the dielectric/semiconductor substrates and the manganese oxide barrier layer.

This example was repeated using a bare silicon coupon in place of a dielectric wafer coupon. After processing, the silicon coupon was subjected to Cu deposition and annealing at 400° C. Thereafter the coupon was inspected for copper silicide formation on the back side. The manganese oxide film was found to perform as an effective diffusion barrier.

EXAMPLE 9

Wafer coupon samples were pretreated with the solution described in Table 4 from Example 3, with the exception that the concentration of HS-1151 was reduced from 30 g/L to 15 g/L. Then the wafer coupon samples were treated with the manganese oxide deposition solution described in Table 2. An additional step that can either be applied before pre-treatment, before deposition step, or after deposition step is described in Table 9 below.

TABLE 9

Additional adhesion promotion step

| Component | Concentration (g/L) |
|---|---|
| Polyacrylate/methacrylate block-copolymer-A | 1.250 |
| Surfactant | 1 |

This additional adhesion promotion step was applied for 1 min at ambient temperature. The coupon was rinsed off with DI water after this additional adhesion promotion step was applied.

The surfactants tested are listed below.
1. Ethylene Diamine-initiated polyether polyol
2. Polyacrylate-based surfactant
3. Alcohol EO/PO
4. Aminopropionate
5. Sulfosuccinate
6. Lauramine Oxide As with Example 1, a wafer coupon sample was stripped in 10 mL stripping solution containing 10% (v/v) sulfuric acid with 5% (v/v) hydrogen peroxide. ICP analysis detected 0.170 mg/L of Mn in the sample where this additional adhesion promotion step was applied before the pre-treatment step. ICP analysis detected 0.116 mg/L of Mn in the sample where this additional adhesion promotion step was applied before the deposition step. ICP analysis detected 0.188 mg/L of Mn in the sample where this additional adhesion promotion step was applied after the deposition step. A blank control sample had an ICP result of <0.0500 mg/L Mn.

The process described can deposit an effective manganese oxide barrier layer for the deposition of a metal layer thereon. The wet process described herein enhanced adhesion between the dielectric/semiconductor substrates and the manganese oxide barrier layer.

This example was repeated using a bare silicon coupon in place of a dielectric wafer coupon. After processing, the silicon coupon was subjected to Cu deposition and annealing at 400° C. Thereafter the coupon was inspected for copper silicide formation on the back side. The manganese oxide film was found to perform as an effective diffusion barrier.

EXAMPLE 10

Wafer coupon samples were pretreated with the solution described in Table 4 from Example 3, with the exception that the concentration of HS-1151 was reduced from 30 g/L to 15 g/L. Then the wafer coupon samples were treated with the manganese oxide deposition solution described in Table 10 below.

TABLE 10

Fluoride Salt manganese deposition solution

| Component | Concentration (g/L) |
|---|---|
| Boric Acid | 10 |
| Sodium Permanganate | 0.612 |
| Fluoride Salt | 0.765 |

The dielectric substrate was processed according to the process sequence described in Example 3.

As with Example 1, a wafer coupon sample was stripped in 10 mL stripping solution containing 10% (v/v) sulfuric acid with 5% (v/v) hydrogen peroxide. The ICP value detected of Mn for this sample was 0.1940 mg/L. A blank control sample had an ICP result of <0.0500 mg/L Mn.

The process described therein can deposit an effective manganese oxide barrier layer for the deposition of a metal layer thereon. The wet process described herein enhanced adhesion between the dielectric/semiconductor substrates and the manganese oxide barrier layer.

This example was repeated using a bare silicon coupon in place of a dielectric wafer coupon. After processing, the silicon coupon was subjected to Cu deposition and annealing at 400° C. Thereafter the coupon was inspected for copper silicide formation on the back side. The manganese oxide film was found to perform as an effective diffusion barrier.

EXAMPLE 11

Wafer coupon samples were pretreated with the solution described in Table 4 from Example 3, with the exception that the concentration of HS-1151 was reduced from 30 g/L to 15 g/L. Then the wafer coupon samples were treated with the manganese oxide deposition solution described in Table 11 below.

TABLE 11

| Manganese Deposition Solution | |
| --- | --- |
| Component | Concentration (g/L) |
| Boric acid | 10.0 |
| Sodium permanganate | 0.612 |

The pH of the deposition solution was reduced to pH 3.5 using hydrochloric acid.

The dielectric substrate was processed according to the process sequence described in Example 3.

As with Example 1, a wafer coupon sample was stripped in 10 mL stripping solution containing 10% (v/v) sulfuric acid with 5% (v/v) hydrogen peroxide. 0.1912 mg/L Mn was detected by ICP whereas <0.050 mg/L Mn was detected from a blank control sample.

This example was repeated using a bare silicon coupon in place of a dielectric wafer coupon. After processing, the silicon coupon was subjected to Cu deposition and annealing at 400° C. Thereafter the coupon was inspected for copper silicide formation on the back side. The manganese oxide film was found to perform as an effective diffusion barrier.

The samples produced in accordance with Examples 1 to 11 were then subjected to a diffusion barrier performance evaluation. The samples were coated with copper deposited by PVD and electroplated with electrochemical deposition (ECD) copper. Thereafter, the performance of the $Mn_xSi_yO_z$ diffusion barrier was evaluated by measuring the sheet resistance (Rs) of the dielectric post 500° C. thermal anneal. Poor diffusion barrier performance would result in increase of the sheet resistance and would indicate the diffusion of copper away from the surface into the bulk of the dielectric.

The results demonstrated that the Mn-based wet diffusion barrier film deposited by the process described herein can demonstrate excellent barrier performance.

COMPARATIVE EXAMPLE 1

Wafer coupon samples were only treated with the manganese oxide deposition solution detailed in Table 2 of Example 1.

A dielectric substrate was processed according to the following process sequence:

Process Sequence:
A. $MnO_2$ deposition solution, 4 minutes, 85° C.
B. DIW rinse
C. $N_2$ dry As with Example 1, a wafer coupon sample was stripped in 10 mL stripping solution containing 10% (v/v) sulfuric acid with 5% (v/v) hydrogen peroxide. The ICP values detected of Mn for the sample treated was <0.0500 mg/L. A blank control sample had an ICP result of <0.0500 Mn.

Copper silicide formation on the back side of the coupon indicated that the deposited film did not perform as a diffusion barrier.

Thus, without the addition of a pretreatment step, the process is not capable of depositing an effective manganese oxide barrier layer.

COMPARATIVE EXAMPLE 2

A pretreatment solution was prepared according to Table 4 shown in Example 3. A manganese oxide deposition solution was prepared in accordance with Table 2 of Example 1.

A dielectric substrate was processed according to the following process sequence:

Process Sequence:
A) Surface treatment solution, 1 minutes, RT
B) Deionized water (DIW) rinse, 20 sec
C) $MnO_2$ deposition solution. 4 minutes, 85° C.
D) Light DIW rinse As with Example 1, a wafer coupon sample was stripped in 10 mL stripping solution containing 10% (v/v) sulfuric acid with 5% (v/v) hydrogen peroxide. The ICP values detected of Mn for the sample treated was <0.0500 mg/L. A blank control sample had an ICP result of <0.0500 mg/L Mn.

Copper silicide formation on the back side of the coupon indicated that the deposited film did not perform as a diffusion barrier.

The process is not capable of depositing an effective manganese oxide barrier layer. The wafer coupon sample needs to be cured after the manganese oxide deposition step to deposit a sufficient manganese barrier layer.

Thus, the process described herein is capable of depositing an effective manganese oxide barrier layer for the deposition of a metal layer thereon. As seen from the Examples, manganese was detected by ICP in samples treated in accordance with the process described herein in an amount of at least 0.05 mg/L, or at least 0.010 mg/L or at 0.20 or even at least 0.50 mg/L as compared with an untreated sample. The wet process described herein requires significantly shorter processing times in contrast to prior art methods and results in a higher conductivity of the interconnect.

Finally, it should also be understood that the following claims are intended to cover all of the generic and specific features of the invention described herein and all statements of the scope of the invention that, as a matter of language might fall therebetween.

What is claimed is:

1. A two-part kit for treating a dielectric or semiconductor substrate to form a diffusion barrier layer thereon, the kit comprising:
   a. an aqueous pretreatment solution comprising one or more adsorption promoting ingredients capable of preparing the substrate for manganese oxide deposition thereon; and
   b. a manganese deposition solution, the manganese deposition solution comprising a manganese compound and an inorganic pH buffer.

2. The kit according to claim 1, wherein the adsorption promoting ingredients comprise one or more nitrogen, silicon, and/or carbon-based cationic polymers or oligomers.

3. The kit according to claim 1, wherein the aqueous pretreatment solution comprises one or more additional ingredients, wherein the one or more additional ingredients are selected from the group consisting of alkalinity agents, adsorption enhancers, adhesion promoters, dispersants, emulsifier, coupling agents, surfactants, sources of copper, sources of chloride, and combinations of the foregoing.

4. The kit according to claim 1, wherein the manganese deposition solution comprises a doping metal along with manganese to enhance the adhesion, continuity and uniformity of the manganese oxide film, wherein co-deposited doping metal comprises one or more metals selected from the group consisting of zinc, cobalt, nickel, chromium, molybdenum, tungsten, rhenium, palladium, rhodium, platinum, iridium, osmium, ruthenium, titanium, zirconium, tantalum, magnesium, and combinations of one or more of the foregoing.

5. The kit according to claim 3, wherein the one or more additional ingredients in the aqueous pretreatment solution comprises an alkalinity agent, wherein the alkalinity agent is selected from the group consisting of alkanolamines, alkali metal hydroxides, alkali metal carbonates, alkali metal borates, alkali metal oxides, ethanolamines, carbonates, and combinations of one or more of the foregoing.

6. The kit according to claim 3, wherein the one or more additional ingredients in the aqueous pretreatment solution comprises an adsorption enhancer, wherein the adsorption enhancer comprises an alkanolamine selected from the group consisting of triethanolamine, diethanolamine, monoethanolamine, 3-amino-1-propanol, amino-2-propanol, and combinations of one or more of the foregoing.

7. The kit according to claim 3, wherein the one or more additional ingredients in the aqueous pretreatment solution comprises a surfactant, wherein the surfactant comprises a polyoxyalkylene alkylether.

8. The kit according to claim 3, wherein the one or more additional ingredients in the aqueous pretreatment solution comprises a source of copper, wherein the source of copper comprises copper sulfate pentahydrate.

9. The kit according to claim 3, wherein the one or more additional ingredients in the aqueous pretreatment solution comprises a source of chloride, wherein the source of chloride is selected from the group consisting of sodium chloride, potassium chloride, ammonium chloride, magnesium chloride, cupric chloride, and combinations of one or more of the foregoing.

\* \* \* \* \*